(12) United States Patent
Wirth

(10) Patent No.: US 6,518,601 B2
(45) Date of Patent: Feb. 11, 2003

(54) LIGHT-EMITTING DIODE

(75) Inventor: Ralph Wirth, Regensburg (DE)

(73) Assignee: Osram Opto Semiconductors GmbH & Co. oHG, Regensburg (DE)

(*) Notice: Subject to any disclaimer, the term of this patent is extended or adjusted under 35 U.S.C. 154(b) by 0 days.

(21) Appl. No.: 09/726,120

(22) Filed: Nov. 30, 2000

(65) Prior Publication Data

US 2002/0056848 A1 May 16, 2002

(30) Foreign Application Priority Data

Nov. 14, 2000 (DE) .......................... 100 56 292

(51) Int. Cl.$^7$ .............................................. H01L 33/00
(52) U.S. Cl. .......................... 257/98; 257/88; 257/94; 257/95; 257/96; 257/97; 257/99
(58) Field of Search ............................... 257/98, 88, 94, 257/95, 96, 97, 99; 372/45, 48

(56) References Cited

U.S. PATENT DOCUMENTS

| | | | | |
|---|---|---|---|---|
| 5,162,878 A | * | 11/1992 | Sasagawa et al. | 257/88 |
| 5,233,204 A | | 8/1993 | Fletcher et al. | |
| 5,309,001 A | * | 5/1994 | Watanabe et al. | 257/778 |
| 5,698,865 A | * | 12/1997 | Gerner et al. | 257/103 |
| 5,744,828 A | | 4/1998 | Nozaki et al. | |
| 5,753,940 A | | 5/1998 | Komoto | |
| 5,779,924 A | | 7/1998 | Krames et al. | |
| 6,307,218 B1 | * | 10/2001 | Steigerwald et al. | 257/94 |

FOREIGN PATENT DOCUMENTS

| | | |
|---|---|---|
| DE | 42 18 806 | 12/1993 |
| DE | 195 17 697 | 11/1996 |
| DE | 197 09 228 | 9/1997 |
| DE | 197 27 233 | 1/1999 |
| EP | 0 544 512 | 6/1993 |
| JP | 4-100277 | 4/1992 |
| JP | 8-111544 | 4/1996 |
| WO | WO 99/07189 | 2/1999 |
| WO | WO 99/39373 | 8/1999 |
| WO | WO 99/43031 | 8/1999 |
| WO | WO 01/61765 | 8/2001 |

OTHER PUBLICATIONS

Patent Abstracts of Japan: E–407, May 28, 1986, vol. 10, No. 145, "Light Emitting Semiconductor Element and Manufacture Thereof", JP 61–6880, dated Jan. 13, 1986.

Patent Abstract of Japan: E–66, Jul. 22, 1981, vol. 5, No. 113, "Light Emitting Diode", 56–50586, dated May 7, 1981.

Patent Abstract of Japan: JP 090–36431, dated Feb. 7, 1997, "Semiconductor Light Emitting Element".

Patent Abstracts of Japan for Japanese 61005585 of Jan. 1, 1986.

* cited by examiner

Primary Examiner—Richard Elms
Assistant Examiner—Douglas Menz
(74) Attorney, Agent, or Firm—Schiff Hardin & Waite

(57) ABSTRACT

A light-emitting diode (1) comprises a window layer (4) above an active layer (3), the window layer having edge webs (6) profiled in a sawtooth-shaped manner. Edge lines (11) with which the current is injected into the active layer (3) proceed above the edge webs (6). The light-emitting diode (1) is distinguished by an especially high output efficiency.

13 Claims, 6 Drawing Sheets

LIGHT-EMITTING DIODE

BACKGROUND OF THE INVENTION

1. Field of the Invention

The invention is directed to a light-emitting diode with an active layer that emits photons and with a window layer that is transparent for the emitted photons and on which contacts for feeding current into the active layer are formed.

2. Description of the Related Art

Light-emitting diodes with the above-mentioned structure are known from U.S. Pat. No. 5,233,204. The known light-emitting diode comprises a light-generating region that is arranged on a light-absorbent substrate. A window layer is arranged above the light-generating region, the thickness of this window layer being selected such that light rays totally reflected at an upper side of the window layer are not directed to the substrate but rather are incident onto a lateral surface of the window layer and can emerge from the window layer at this surface. Additionally, the window layer has the job of distributing the current supplied into the window layer via a contact pad uniformly across the active region.

One disadvantage of the known light-emitting diode is that light generated in the active region immediately under the contact pad cannot escape without further effort. In particular, the light rays proceeding from the active region in the direction onto the contact pad are reflected directly back into the absorbent substrate by the contact pad.

European Patent Document EP 0 544 512 A discloses that the window layer be forgone and that interconnects structured in a tree-like manner be provided on the surface of the light-emitting diode instead. The specific quality provided by this approach is that the interconnects are insulated from the layer lying below up to the tips of the interconnect branches. The current is therefore only supplied in a punctiform fashion into the light-generating layers lying below. These locations, however, are uniformly distributed across the surface of the light-emitting diode. In order to increase the light yield, it is also proposed that beveled light exit surfaces be provided in the proximity of the light-emitting points so that the generated light can emerge from the light-emitting diode after a short distance. The beveled light exit surfaces are accomplished by a flat mesa-like fashioning of the layers lying under the interconnect. These layers are a matter of the doped cover layers required for the formation of a double hetero structure between which an undoped, light-emitting layer is arranged. Compared to the Prior Art, the light yield can be enhanced by a factor of 1.5 with such an arrangement.

SUMMARY OF THE INVENTION

Proceeding from this Prior Art, the object of the invention is to create a light-emitting diode with an enhanced light yield.

This object is inventively achieved in that the contacts are formed by interconnect lines and in that the window layer comprises lateral surfaces proceeding along the interconnect lines, the lateral surfaces being profiled with projections extending transversely relative to the interconnect lines.

By fashioning the contacts as interconnect lines, the current is injected into the active region not only in a punctiform fashion, but in a large-area manner. The photons generated in the active layer can leave the light-emitting diode via the lateral surfaces of the window layer. This also applies to those photons whose path proceeds in the window layer along the interconnect lines. Due to the profiling of the lateral surfaces with projections extending transversely relative to the interconnect lines, these photons also impinge a section of the lateral surface at an angle that is smaller than the angle for a total reflection. These photons are thus not lost but also contribute to the light yield. Experimentally, an increase of the light yield by a factor of 2 was found compared to the light-emitting diodes with a simple window layer known from the Prior Art.

In a preferred development of the invention, the projections are fashioned like a frustum of a pyramid.

Given a suitable angle of the frustum of the pyramid, a photon trajectory proceeding therein will exhibit a different incident angle at every incidence onto the sidewalls of the pyramidal frustum. It is therefore likely that, following multiple reflection, the incident angle will eventually become smaller than the critical angle for the total reflection, and the photon can emerge from the window layer.

Further advantageous developments include having the projections come to a point, having the projections comprise a triangular base area, having the projections form a sawtooth-shaped profile on the lateral surfaces, and/or having an apex angle of the projections coming to a point being less than 10° in the point. An angle between a normal of sidewalls of the projections relative to a normal of the active layer may be provided which is between 45° and 88°. The invention may include having the lateral surfaces extend across the active layer, and the projections provided may be prism-shaped. A profiled web edge having a constriction with a height to width ratio between 0.1 and 10 may be provided in an embodiment of the invention. Interconnect lines may be fashioned as interconnects running all around and along the edge of the light-emitting diode. These interconnect lines may be connected to a central contact pad by connecting track insulated from the window layer. These may also be provided on edge webs.

BRIEF DESCRIPTION OF THE DRAWINGS

The invention is explained in detail below on the basis of the attached drawings.

DESCRIPTION OF THE PREFERRED EMBODIMENTS

Figure 1:
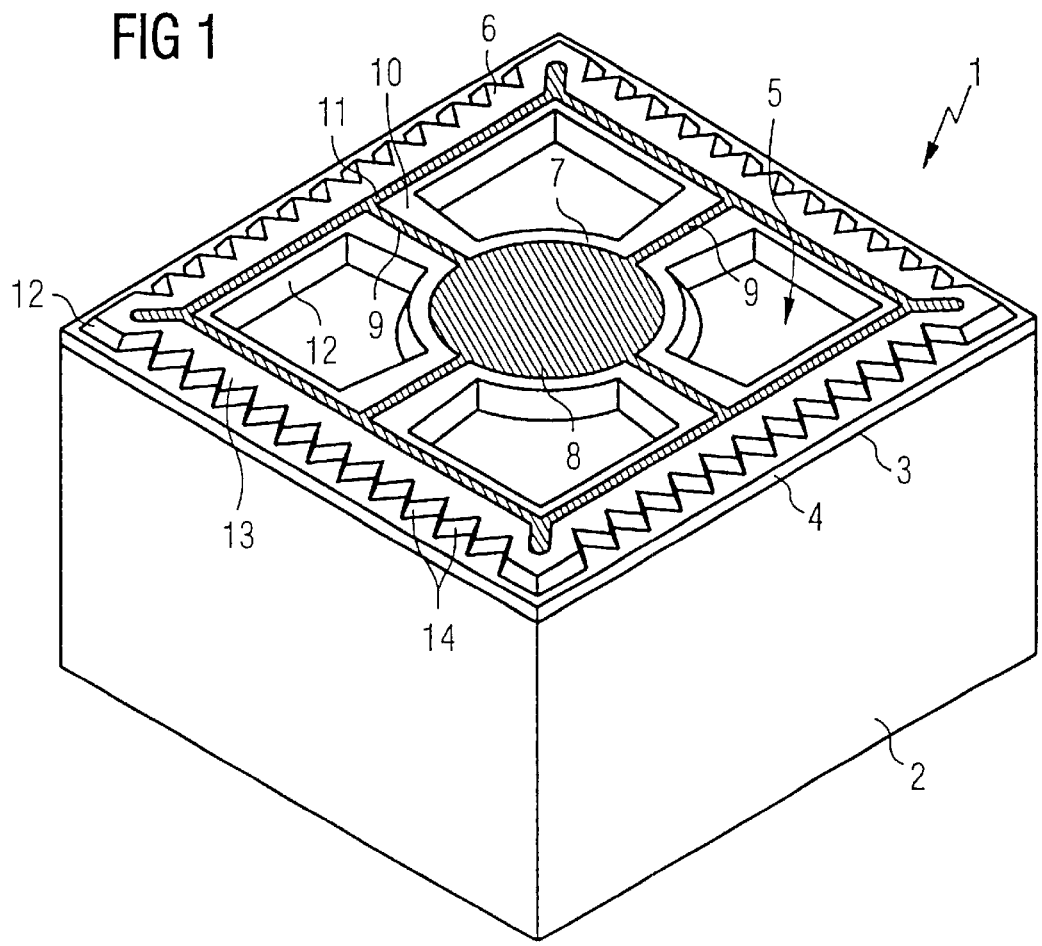
FIG. 1 is a perspective view of a light-emitting diode that comprises interconnect lines on a window layer having lateral surfaces profiled in a sawtooth-like manner.

The light-emitting diode 1 from FIG. 1 comprises a substrate 2 on which an active layer 3 is applied. A window layer 4 that comprises all around edge webs 6 on an upper side 5 is situated above the active layer 3. A contact pad 8 that is insulated from the window layer 4 is located on an elevation 7 in the middle of the upper side 5. The contact pad 8 is connected to edge lines 11 on the edge webs 6 via connecting lines 9 that proceed on connecting webs 10. The connecting lines 9 are also insulated from the window layer 4. The current is therefore only injected into the active layer 3 from the edge lines 11.

The edge webs 6 comprise lateral surfaces 12, the outer surfaces of the edge webs 6 being profiled in a sawtooth-like manner with projections 13 extending transversely relative to the edge lines 11. The projections 13 are fashioned like a frustum of a pyramid and comprise beveled sidewalls 14.

Figure 2:
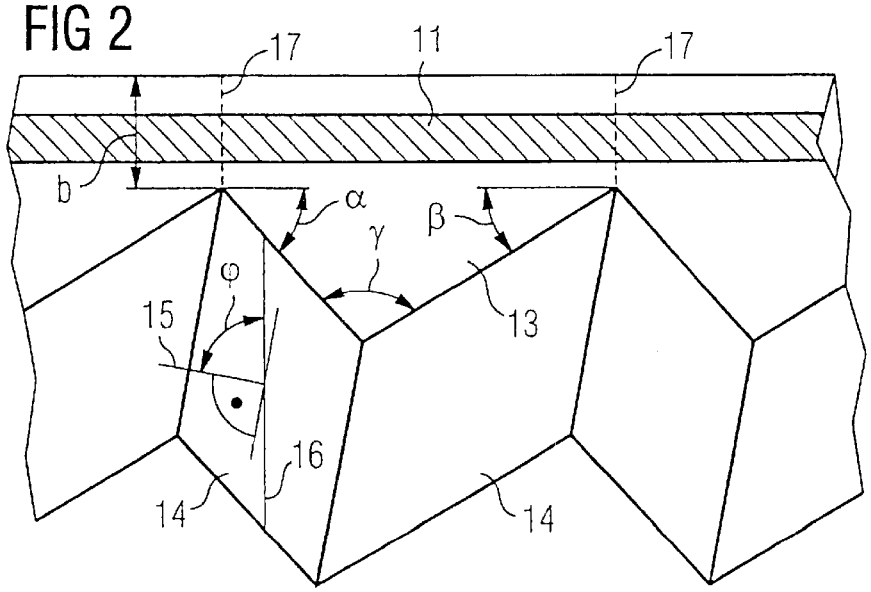
FIG. 2 is a magnified illustration of the profiling of the lateral surfaces of the light-emitting diode from FIG. 1.

FIG. 2 shows one of the projections 13 magnified. The slope of the sidewalls 14 is selected such that the angle ψ between a normal 15 of a sidewall 14 and a normal 16 of the active layer 3 is less than 88° and more than 45°. The angles α, β, and γ are preferably selected such that one of the angles is less than 10°. Moreover, none of the angles should equal 45° or 60°, since the output efficiency drops in these highly symmetrical cases. Furthermore, it is advantageous when 0.1<V<10, preferably 1<V<3, is valid for the ratio V of the width b of constrictions 17 of the edge webs 6 to the height 16 of the edge webs 6.

Figure 3:
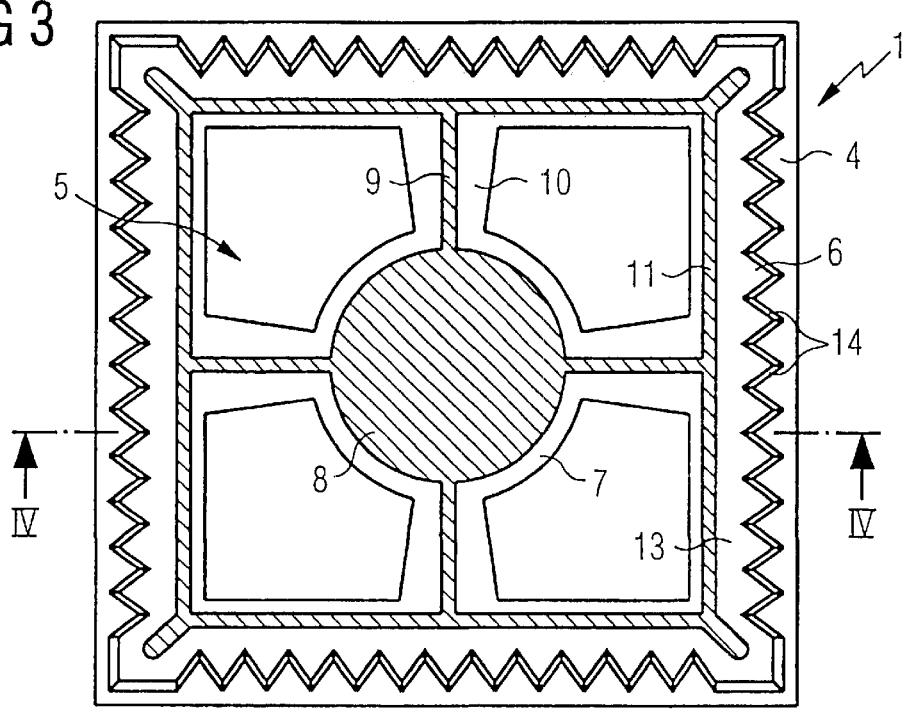
FIG. 3 is a plan view onto the light-emitting diode from FIG. 1.
Figure 4:
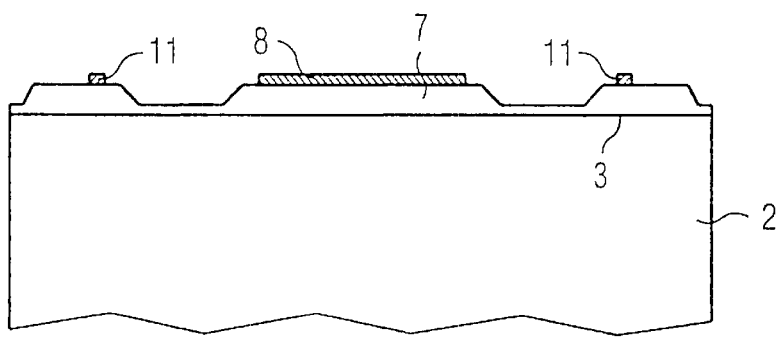
FIG. 4 is a cross section through the light-emitting diode from FIG. 3 along the section line IV—IV.

FIG. 3 shows a plan view onto the light-emitting diode from FIGS. 1 and 2. FIG. 4 shows a cross section along the section line IV—IV in FIG. 3.

Figure 5:
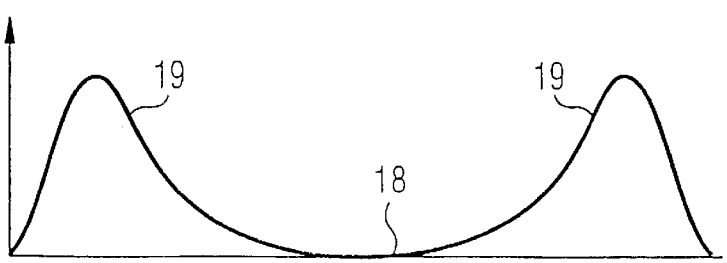
FIG. 5 is a graph showing the light generation in the active layer along the section line IV—IV.

FIG. 5, finally, shows the light-generation rate along the section line IV—IV in FIG. 3. The light generation rate is the rate of photons generated in the active layer 3, which essentially reflects the current density and, thus, the specific properties of the respective current injection.

One can see that the light generation rate is very slight (absent) immediately under the contact pad 8. Accordingly, the light generation rate exhibits a minimum 18 at this point. In the region of the edge webs 6, however, the light generation rate exhibits maximums since the current is injected into the window layer 4 in this region by the edge lines 11 that, in contrast to the contact pad 8 and the connecting lines 9, are not insulated from the window layer. It is significant for an efficient light output that the profiled edge webs 6 are located in the immediate proximity of the maximums 19 of the light generation rate. The combination of local current injection and structuring on the upper side of the window layer 4, leads to a high light yield. This is explained in greater detail below on the basis of the comparative examples shows in FIGS. 6 through 11.

Ray tracing simulations are provided to support the following discussion. A base area of the light-emitting diodes of 300 micrometers×300 micrometers were assumed for these simulations. It was also assumed that the respective substrate completely absorbs photons. The thickness of the active layer was set at 200 nm and an absorption coefficient of 10,000/cm was set. Furthermore, photon recycling in the active layer was taken into consideration, in which the efficiency of the radiant recombination was set at 80%. The thickness of the window layer 10 was set at 10 micrometers. The reflectivity of the contacts was estimated to be 30%. The value 3.2 was set for the refractive index of the active layer. Otherwise, the refractive index within the semiconductor chip lay at 3.5. The value 1.5 was selected for the refractive index of the surrounding medium.

COMPARATIVE EXAMPLE 1

Figure 6:
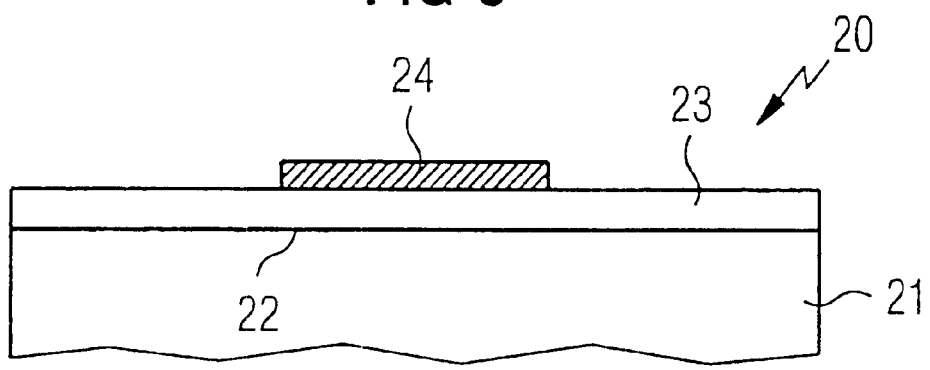
FIG. 6 is a cross section through a traditional light-emitting diode with an active layer applied on a substrate, an additional window layer being arranged on the active layer.

FIG. 6 illustrates a cuboid light-emitting diode 20 that comprises a substrate 21 on which an active layer 22 is formed, the active layer being covered by a window layer 23. In addition, a central contact pad 24 that is not insulated from the window layer 23 is situated on the window layer 23. Accordingly, this configuration produces the distribution curve 25 of the light generation rate shown in FIG. 7.

Figure 7:
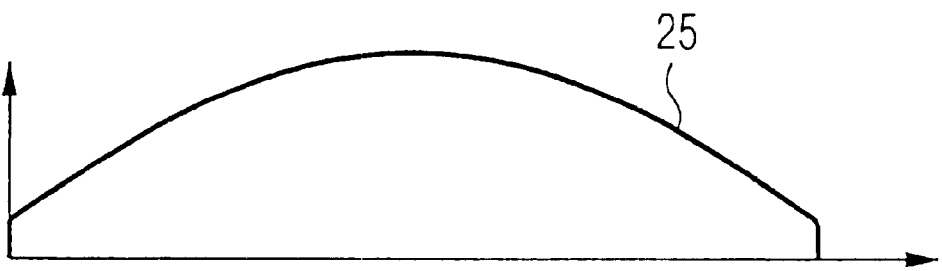
FIG. 7 is a graph showing the light generation in the active layer across the cross section from FIG. 6.

A comparison of FIGS. 6 and 7 shows that the maximum light generation occurs directly under the central contact pad 24. A majority of the photons generated at this location, however, are either directly absorbed at the boundary surface to the contact pad 24 or are reflected back into the absorbent substrate 21 from the contact pad 24. Accordingly, only about 5% of the generated photons are coupled out of the light-emitting diode 20 given the light-emitting diode 20. The ratio of emerging photons to the number of generated photons is referred to in brief below as output efficiency. For a relative comparison, the efficiency of the light-emitting diode 20 is set at 100% below.

COMPARATIVE EXAMPLE 2

Figure 8:
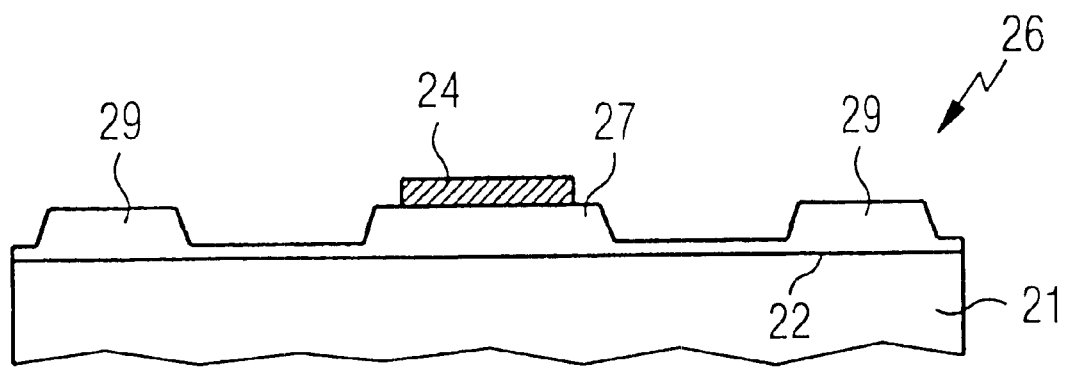
FIG. 8 is a cross section through a light-emitting diode whose active layer is structured and that comprises a central contact pad.
Figure 9:
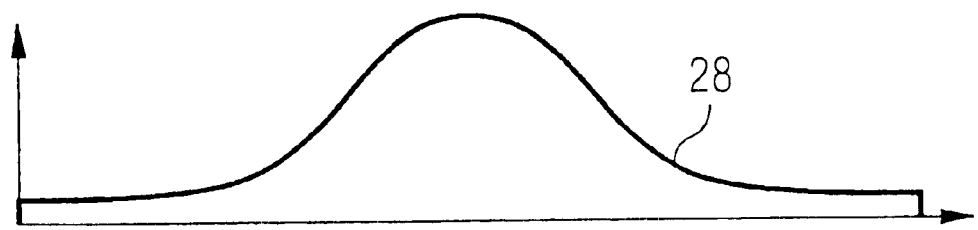
FIG. 9 is a graph showing the light generation in the active layer of the light-emitting diode from FIG. 8.

FIG. 8 shows the cross section of a further light-emitting diode 26 whose window layer 27 is structured according to the window layer 4 of the light-emitting diode 1. The current injection into the active layer 22 also takes place via the central contact pad 24 given the light-emitting diode 22, producing the distribution of the light generation rate concentrated under the contact pad 24 that is shown in FIG. 9.

It is clear that the light-emitting diode 26 has a poor output efficiency since the light generation occurs mainly directly under the contact pad 24. In order to be able to evaluate the influence of the structuring of the window layer 27, the output efficiency was therefore calculated with the distribution curve 25 and not with the distribution curve 28. Relative to the output efficiency of the light-emitting diode 20 in FIG. 6, an output efficiency of 150% is derived from the calculation. This is already noteworthy in and of itself since the light generation given the distribution curve 25 is also definitely not concentrated immediately under the edge webs 29 that correspond to the edge webs 6 of the light-emitting diode 1. The calculation therefore even at this stage documents that advantageous effect of the sawtooth-profiled edge webs 6 provided at the edge of the light-emitting diode 1.

COMPARATIVE EXAMPLE 3

Figure 10:
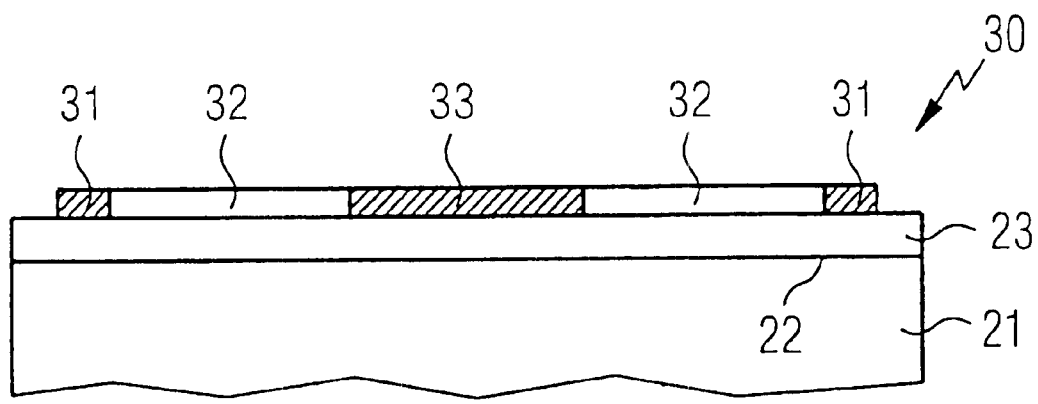
FIG. 10 is a cross section through a light-emitting diode with an unstructured window layer whose interconnects are fashioned corresponding to the interconnects of the light-emitting diode from FIG. 1.

FIG. 10 shows a further light-emitting diode 30 whose window layer 23 is constructed similar to the light-emitting diode 20 in FIG. 6. The light-emitting diode 30, however, has edge lines 31 and connecting lines 32 as well as a central contact pad 33 that are fashioned exactly like the edge lines 11, the connecting lines 9 and the contact pad 8 of the light-emitting diode 1. In particular, the contact pad 33 and the connecting lines 32 are insulated from the window layer 23.

Figure 11:
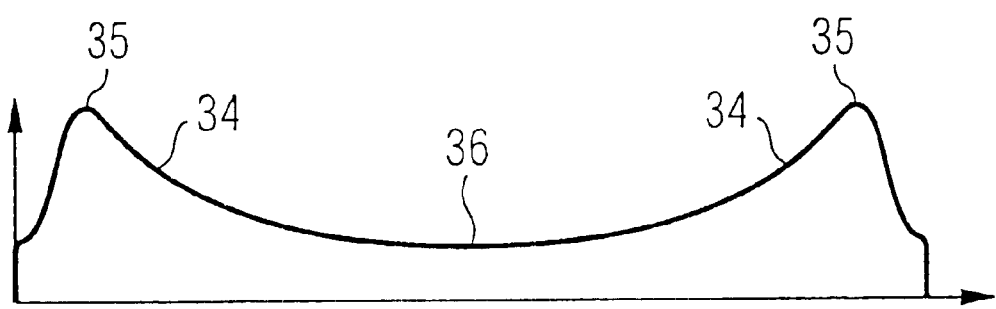
FIG. 11 is a graph showing the light generation in the active layer of the light-emitting diode from FIG. 10.

This produces the distribution curve 34 of the light generation rate shown in FIG. 11 which exhibits maximums 35 under the edge lines 33. Due to the current-spreading function of the window layer 23, a part of the current injected into the active layer 22 nonetheless flows into the region under the central contact pad 33. Light generation therefore also still occurs in the minimum 36 of the distribution curve 34. This is probably the reason why the calculation for the relative output efficiency of the light-emitting diode 30 only yielded 140%. For achieving an advantageous output efficiency, it therefore suffices to avoid a high light generation rate under the contact pad 24.

Embodiment

Finally, the calculations were also implemented for the exemplary embodiment described on the basis of FIGS. 1 through 4. Due to the edge webs 6, the light generation is additionally concentrated in this case, so that the light generation rate drops to nearly zero in the minimum. Moreover, the profiled edge webs 6 are located in the immediate proximity of the maximums 19 of the light generation rate, so that the generated light can be coupled out without having to cover great distances.

For the light-emitting diode 1, the calculation yielded an output efficiency of 275% relative to the output efficiency of the light-emitting diode 20. It thus turns out that the targeted injection of the current under the profiled edge webs 6 results in a gain of output efficiency that proceeds far beyond the gain that could be anticipated from the combination of the individual measures.

The pyramidal frustum-shaped fashioning of the edge webs 6 also contributes to the high gain in output efficiency. Due to the selection of the angles α, β, and γ, it is likely that, following multiple reflections at the sidewalls 14 and the inside lateral surfaces 12, the incident angle will eventually become smaller than the critical angle for the total reflection, and the photons can emerge from the light-emitting diode 1. Over and above this, the angle of inclination of the sidewalls 14 assures that the photons initially proceeding upward from the active layer 3 proceed flatter with every reflection, so that they can ultimately emerge from the edge webs 6.

The projections 13 can also be prisms having a triangular base area when the edge webs extend into the active zone.

Figure 12:
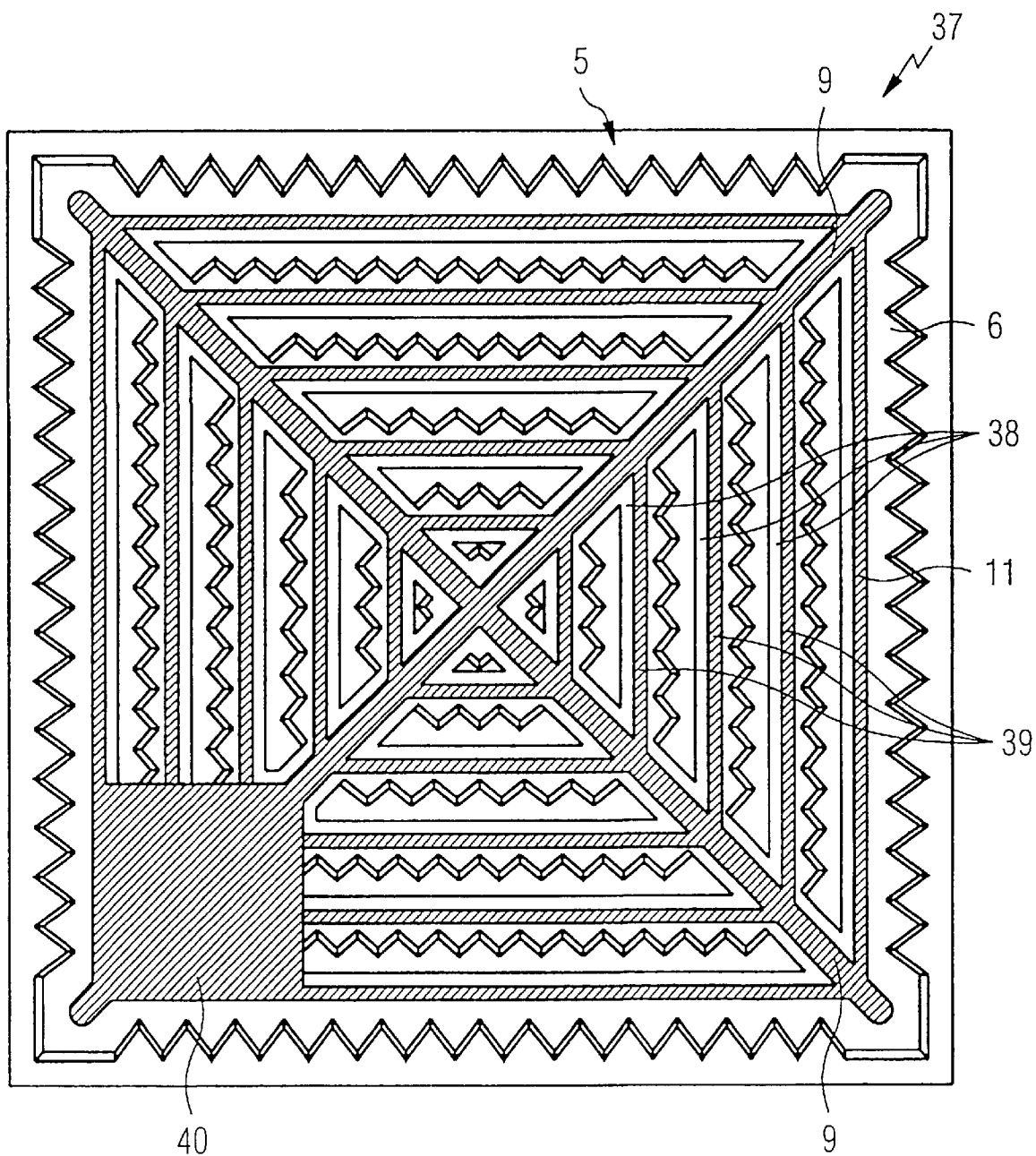
FIG. 12 is a plan view of a modified form of the light-emitting diode of the invention.

FIG. 12, finally, shows another exemplary embodiment of a light-emitting diode 37 that comprises further intermediate webs 38 in addition to the edge webs 6, the intermediate webs 38 being respectively profiled with projections 13 and intermediate lines 39 proceeding on them. In this light-emitting diode 37, moreover, a contact pad 40 is situated at the edge of the light-emitting diode 37. The light-emitting diode 37 will likely exhibit an output efficiency that is even more enhanced compared to the light-emitting diode 1.

In conclusion, a particular advantage of the light-emitting diodes 1 and 30 is that their area expanse can be selected nearly arbitrarily large since an enlargement of the area expanse does not compel a corresponding scaling of the layer thickness of the window layer 4. An increase in the layer thickness, would make manufacture considerably more difficult.

The above-described light-emitting diodes are illustrative of the principles of the present invention. Numerous modifications and adaptations thereof will be readily apparent to those skilled in this art without departing from the spirit and scope of the present invention.

What is claimed is:

1. A light-emitting diode comprising:

an active layer that emits photons;

a window layer that is transparent for said emitted photons and on which contacts for feeding current into said active layer are formed, said contacts being formed by interconnect lines, said window layer further comprising lateral surfaces proceeding along said interconnect lines, said lateral surfaces being profiled with projections extending transversely relative to said interconnect lines.

2. The light-emitting diode according to claim 1, wherein said projections come to a point.

3. The light-emitting diode according to claim 1, wherein said projections comprise a triangular base area.

4. The light-emitting diode according to claim 1, wherein said projections form a sawtooth-shaped profile on said lateral surfaces.

5. The light-emitting diode according to claim 2, wherein an apex angle of said projections coming to a point is less than 10° in said point.

6. The light-emitting diode according to claim 1, wherein an angle between a normal of sidewalls of said projections relative to a normal of said active layer lies between 45° and 88°.

7. The light-emitting diode according to claim 1, wherein said lateral surfaces extend across said active layer.

8. The light-emitting diode according to claim 7, wherein said projections are prism-shaped.

9. The light-emitting diode according to claim 1, wherein a ratio of height to width of a constriction of a profiled edge web of said window layer is greater than 0.1 and less than 10.

10. The light-emitting diode according to claim 1 wherein said interconnect lines are fashioned as interconnects running all around and along the edge of said light-emitting diode.

11. The light-emitting diode according to claim 10, wherein said all around interconnects are connected to a central contact location by connecting tracks insulated from said window layer.

12. The light-emitting diode according to claim 10 wherein said all around interconnects are provided on edge webs.

13. A light-emitting diode according to claim 1, wherein:

said interconnect lines are co-planar with a top surface of said light-emitting diode;

said projections comprise a base portion and a top portion that is opposite said base portion; and said base portion and said top portion of said projections are co-planar with said interconnect lines.

* * * * *